(12) United States Patent
Maturana et al.

(10) Patent No.: US 10,360,316 B2
(45) Date of Patent: Jul. 23, 2019

(54) INTEGRATION OF SIMULATION OF A MACHINE FOR INDUSTRIAL AUTOMATION

(71) Applicant: ROCKWELL AUTOMATION TECHNOLOGIES, INC., Mayfield Heights, OH (US)

(72) Inventors: Francisco Maturana, Lyndhurst, OH (US); Leopoldo Paredes, Akron, OH (US); Axel Rodriguez, Aurora, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1416 days.

(21) Appl. No.: 13/834,850

(22) Filed: Mar. 15, 2013

(65) Prior Publication Data

US 2014/0180644 A1    Jun. 26, 2014

Related U.S. Application Data

(60) Provisional application No. 61/740,696, filed on Dec. 21, 2012.

(51) Int. Cl.
| | |
|---|---|
| G06F 17/50 | (2006.01) |
| G05B 19/05 | (2006.01) |
| G05B 17/02 | (2006.01) |
| G06F 9/445 | (2018.01) |

(52) U.S. Cl.
CPC ......... *G06F 17/5009* (2013.01); *G05B 17/02* (2013.01); *G05B 19/05* (2013.01); *G05B 19/052* (2013.01); *G05B 19/056* (2013.01); *G05B 2219/15012* (2013.01); *G05B 2219/23274* (2013.01); *G05B 2219/23456* (2013.01); *G06F 9/44505* (2013.01)

(58) Field of Classification Search
None
See application file for complete search history.

(56) References Cited

U.S. PATENT DOCUMENTS

| | | | | |
|---|---|---|---|---|
| 4,901,253 | A * | 2/1990 | Iwano | G01B 21/04 345/419 |
| 5,574,637 | A * | 11/1996 | Obata | G05B 19/41835 318/568.2 |
| 5,796,618 | A * | 8/1998 | Maeda | G05B 19/4097 700/104 |
| 6,292,707 | B1 * | 9/2001 | Hair | G06F 17/50 700/104 |
| 6,442,441 | B1 * | 8/2002 | Walacavage | G05B 19/056 341/173 |

(Continued)

*Primary Examiner* — Kibrom K Gebresilassie (57) ABSTRACT

Methods and systems for creating and running and industrial control system simulation are described herein. The simulation may include animation of a complex machine linked with the industrial control device controlling the complex machine. The simulation may also include links to the physical I/O and other modules of the industrial controller to enhance the functionality of the simulation. This may increase the likelihood that the timing and functionality of the simulation may be more like real-time operation of the industrial control system. This may enhance the system design and save time of system design and start-up and troubleshooting of the operational industrial control system.

20 Claims, 7 Drawing Sheets

(56) References Cited

U.S. PATENT DOCUMENTS

| | | | | |
|---|---|---|---|---|
| 6,526,373 B1* | 2/2003 | Barral | ................... | B25J 9/1666 |
| | | | | 700/245 |
| 6,748,283 B2* | 6/2004 | Walacavage | ..... | G05B 19/41885 |
| | | | | 700/105 |
| 6,847,922 B1* | 1/2005 | Wampler, II | ....... | G05B 19/4069 |
| | | | | 700/251 |
| 6,928,337 B2* | 8/2005 | Watanabe | ............... | B25J 9/1671 |
| | | | | 361/679.02 |
| 7,130,704 B2* | 10/2006 | McKelvey | ............ | G05B 19/054 |
| | | | | 700/87 |
| 7,308,327 B2* | 12/2007 | Coburn | .............. | G05B 19/4185 |
| | | | | 700/97 |
| 7,702,491 B2* | 4/2010 | Walacavage | ......... | G05B 19/056 |
| | | | | 700/97 |
| 7,856,279 B2* | 12/2010 | Hood | ................. | G05B 19/0426 |
| | | | | 700/19 |
| 8,239,339 B2* | 8/2012 | Weber | ..................... | G06N 5/00 |
| | | | | 706/47 |
| 8,594,814 B2* | 11/2013 | Rovaglio | ................ | G05B 17/02 |
| | | | | 700/83 |
| 9,104,197 B2* | 8/2015 | Miegel | ................... | B25J 9/1664 |
| 9,114,529 B2* | 8/2015 | Wu | ....................... | G05B 19/414 |
| 9,535,413 B2* | 1/2017 | Shah | ................... | G05B 19/0426 |
| 10,018,978 B2* | 7/2018 | Bliss | ................... | G05B 19/056 |
| 2002/0040291 A1* | 4/2002 | Walacavage | ......... | G05B 19/056 |
| | | | | 703/23 |
| 2002/0120921 A1* | 8/2002 | Coburn | ............ | G05B 19/41885 |
| | | | | 717/140 |
| 2002/0193972 A1* | 12/2002 | Kudo | ............... | G05B 19/41885 |
| | | | | 703/1 |
| 2003/0018405 A1* | 1/2003 | Walacavage | ..... | G05B 19/41885 |
| | | | | 700/105 |
| 2003/0045947 A1* | 3/2003 | Wampler | ........... | G05B 19/4069 |
| | | | | 700/32 |
| 2003/0074170 A1* | 4/2003 | Watanabe | .............. | B25J 9/1671 |
| | | | | 703/6 |
| 2006/0064289 A1* | 3/2006 | Walacavage | ......... | G05B 19/056 |
| | | | | 703/7 |
| 2006/0167667 A1* | 7/2006 | Maturana | ............... | G05B 17/02 |
| | | | | 703/6 |
| 2007/0067056 A1* | 3/2007 | Nishinohara | .... | G05B 19/41885 |
| | | | | 700/97 |
| 2009/0265157 A1* | 10/2009 | Piepenbrock | .......... | G05B 19/05 |
| | | | | 703/21 |
| 2010/0114337 A1* | 5/2010 | Husoy | ................... | G06F 3/0484 |
| | | | | 700/17 |
| 2013/0090745 A1* | 4/2013 | Frazer | ................... | G05B 15/02 |
| | | | | 700/12 |
| 2014/0156234 A1* | 6/2014 | Maturana | ........... | G06F 17/5009 |
| | | | | 703/2 |

* cited by examiner

INTEGRATION OF SIMULATION OF A MACHINE FOR INDUSTRIAL AUTOMATION

RELATED APPLICATIONS

This application hereby claims the benefit of, and priority to, U.S. Provisional Patent Application 61/740,696, titled "INTEGRATION OF SIMULATION OF A MACHINE FOR INDUSTRIAL AUTOMATION", filed Dec. 21, 2012, and which is hereby incorporated by reference in its entirety for all purposes.

TECHNICAL BACKGROUND

In many industrial environments the quantity and complexity of equipment used requires automation in order to make productive use of the equipment. Automation system design is enhanced by simulation of the operation of the industrial automation processor and animated simulation of controlled devices.

Some controlled devices may be complex and difficult to simulate, but need to be simulated to insure the entire industrial control system will operate as programmed.

OVERVIEW

In various embodiments, methods and systems for creating simulations of complex controlled devices for simulations of industrial control systems are described herein. A computer aided design (CAD) file of a complex machine may be converted to a format capable of being used with an industrial controller and/or an industrial control device. An industrial control device file, such as that of a motion controller, can be linked with portions of the CAD file describing the portions of the machine the control device is controlling.

The resulting file can be linked to physical inputs and outputs of an industrial controller, and a simulation may be created incorporating animation of the machine to further make the simulation more realistic in looks and functionality. This may reduce delays within the system and software of the simulation, thereby increasing the likelihood that the timing, sequence, and/or operation of the simulation may be more like real-time operation of the industrial control system including the complex machine. This may enhance the system design and save time of system design and start-up and troubleshooting of the operational industrial control system.

It must be noted that the invention can be used in two main phases: (1) design phase runtime and (2) commissioned phase runtime. In (1), the industrial control device can be real or emulated. Either encapsulation is connected to simulation. In (2), the industrial control device and the simulation executes in parallel with real controller. Moreover, the purpose of the invention is to help system engineers create optimized industrial control programs. The system allows for online editing of the control program. The actual design is incrementally improved in virtual design.

This overview is provided to introduce a selection of concepts in a simplified form that are further described below in the Technical Disclosure. It should be understood that this Overview is not intended to identify key features or essential features of the claimed subject matter, nor is it intended to be used to limit the scope of the claimed subject matter.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

Industrial control systems may be large and complex in their size and speed at which they operate. Simulation of the system may be desirable before the system is started up to minimize problems associated with startup and operation of a complex industrial control system.

Simulations using animated simulations with an industrial control device, and actual inputs, outputs, and other modules from the industrial controller may provide a better simulation, because the actual control system I/O and timing are used, and complex machines, such as robotic devices, are simulated so that the entire system can be simulated. Problems may arise with the timing of the simulation and operation of the actual industrial control system.

The present disclosure describes a method, system, and apparatus for creating and executing a simulation of an industrial control system. The simulation can include simulation or animation of a complex machine such as a robot or other complex device.

Advanced product development methods may be used in industrial manufacturing technology to reduce product design cycle time and sustain in the market competition. More complex products are designed using sophisticated CAD design tools. These CAD designs contain high level model information like body mass, inertia, stiffness, and tension. These models also contain information about the integrity between different parts, clearance, joint movement, etc. All these parameters can be defined in the CAD assembly drawings.

Physical prototypes are made from these conceptual 3D designs. Industrial Programmable Logic Controllers (PLCs) are used to control these designed prototype mechanisms, once built. Control algorithms are designed for the required automation applications. Traditional system engineering uses physical prototypes to validate various aspects of automation solutions. Sometimes this process requires costly hardware to validate control algorithms without having physical prototypes.

If some problems occur during the physical prototyping, there are fewer chances to modify the design. This aspect of design introduces limitations into the product development cycle and potentially affects the time-to-market of the final product. Furthermore, classical control systems can no longer stand alone in controlling process and machines. They may need automated intelligence supporting their operations. The combined action of pure control with agents will make the industrial system more complicated to validate at design. Thus the need for thinking about a virtual design engineering environment comes to the table.

As a result of the following disclosure, the requirement for a work flow to integrate mechanical, electrical, and software components may shorten product development schedules. A model-based simulation and visualization system may be used to validate control algorithms early in the process while designing the components. In the control engineering domain, controlling mechanical systems like robots, conveyors, or sliding mechanisms may require physical models to validate system parameters like position, torque, and speed based on variable demand and throughput.

To reduce the product development cycle time, a flexible manufacturing system may be used, in which design and control programs can be easily tuned. Such a system may use model based simulation and visualization that will help to evaluate dynamical aspects of the components under load and to visualize the mechanical response of the machine on the fly, earlier in the design lifecycle. This is the theory of a rapid prototyping control validation system. Control program algorithms can be applied to the simulation model and the system response can be feedback to controls and viewed using 3D virtual models.

Different tools and software packages can be used for the steps of product development for design, control and simulation. Each tool may have different data types and information exchange requirements. Systems and methods have been developed for a mechatronics-based system to integrate design, simulation, controllers, and visualization into a development environment. This environment is intended to smooth a transition from the design cycle into the runtime validation, and to rapidly evaluate the effect of the design decisions into the real time model of the machine.

Aspects of the present disclosure may aid in the reduction of a project budget by eliminating the need for physical prototyping. Aspects of the present disclosure may also aid in the reduction of engineering hours and allowing for higher quality system. Aspects of the present disclosure may also aid in the reduction of a project design to market times.

Figure 1:
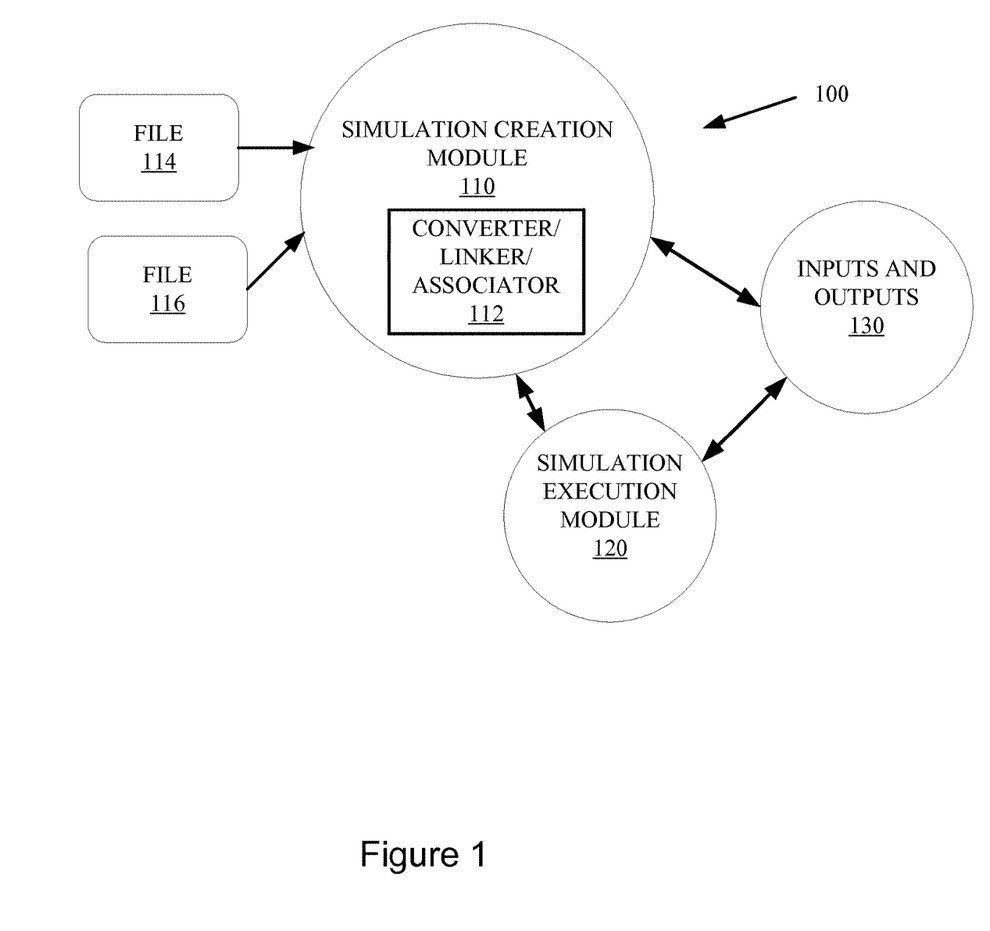
FIG. 1 illustrates an example software system for creating and operating an industrial system simulation.
Figure 2:
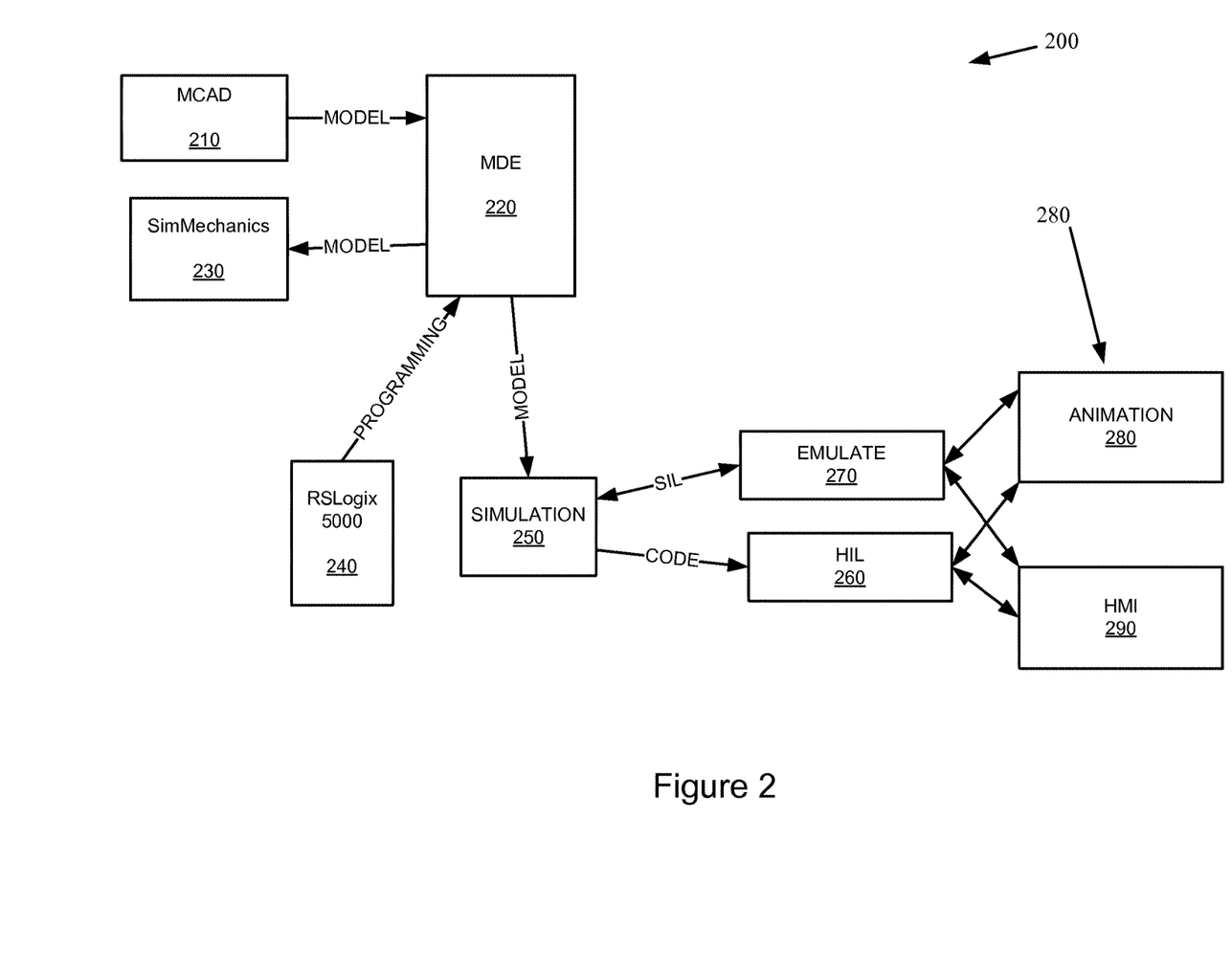
FIG. 2 illustrates an example of a system capable of creating and operating an industrial system simulation.
Figure 3:
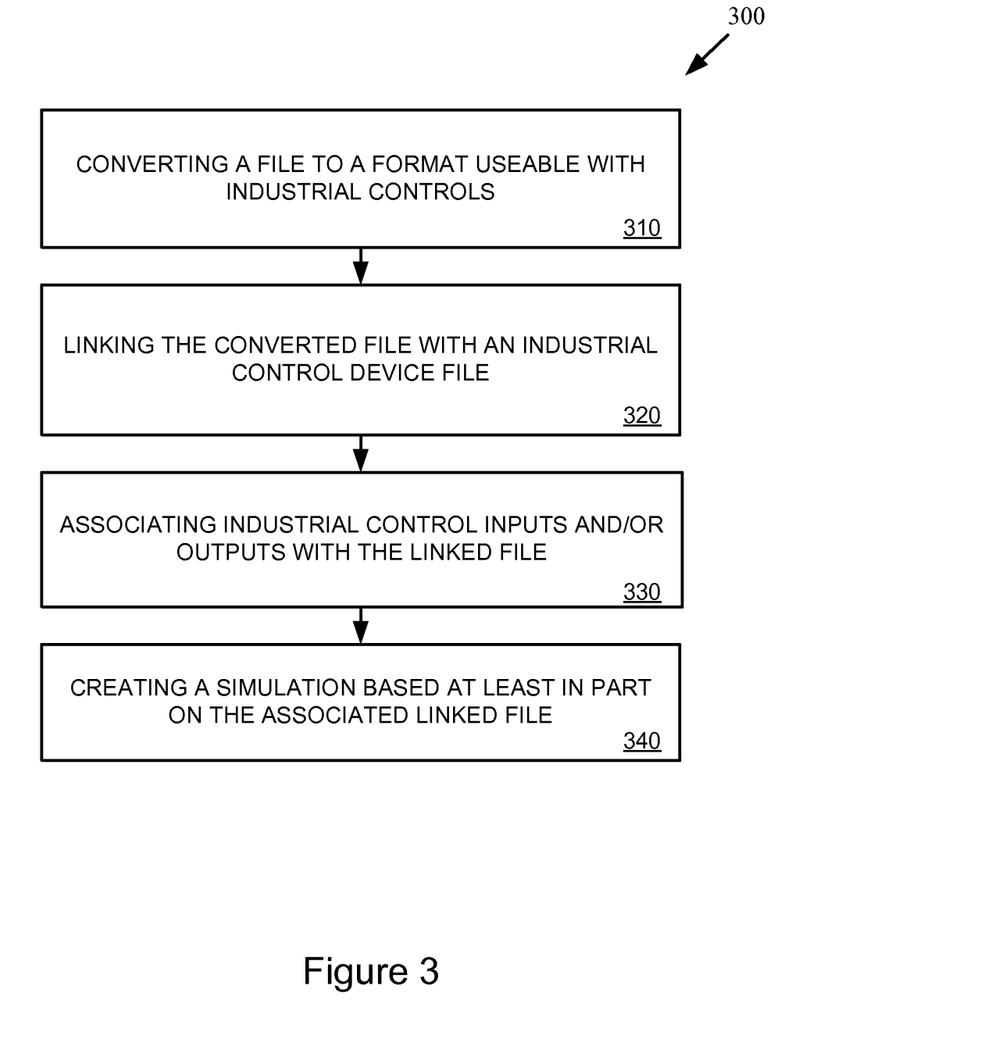
FIG. 3 illustrates a flow chart of an example method of for creating an industrial system simulation.
Figure 4:
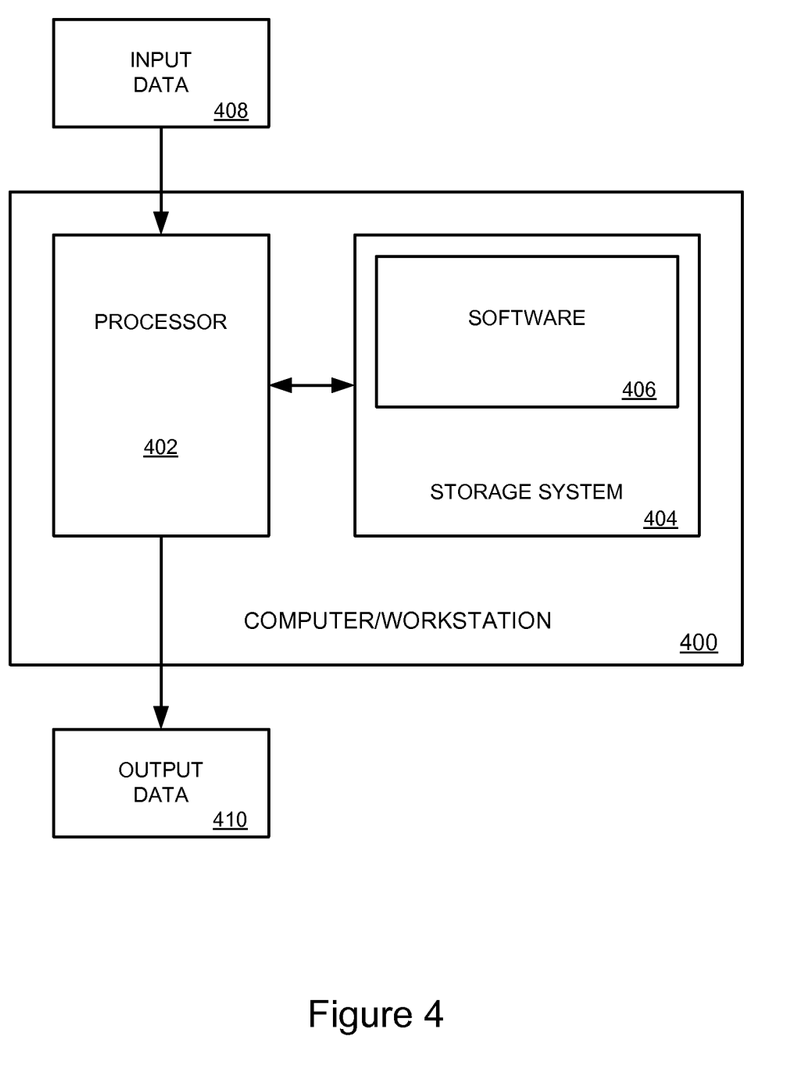
FIG. 4 illustrates a block diagram of an example computer system configured to operate as a computer in an industrial system simulation.
Figure 5:
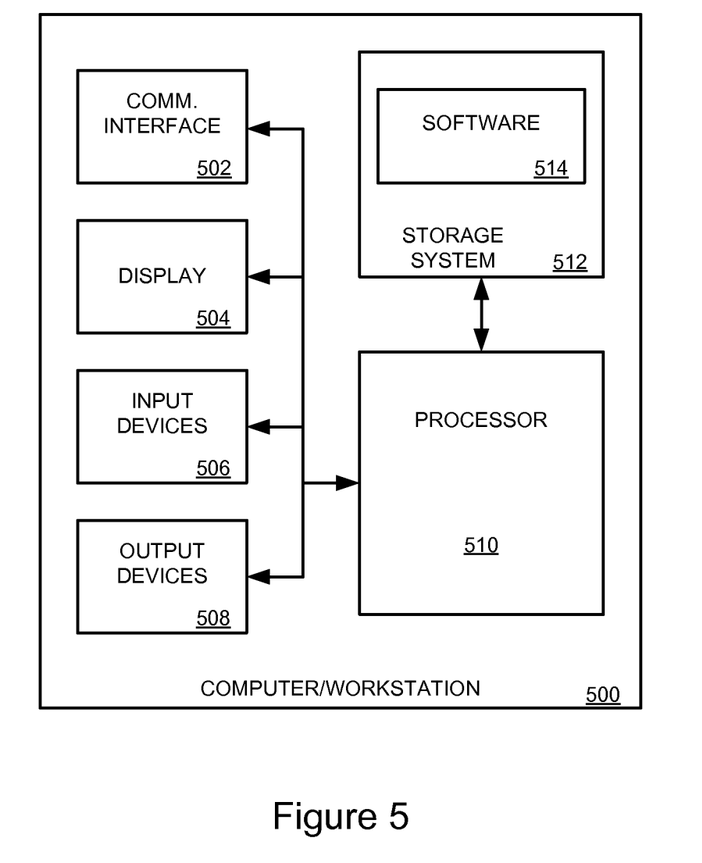
FIG. 5 illustrates a block diagram of an example computer system capable of accomplishing all or a portion of the processes within an industrial system simulation.
Figure 6:
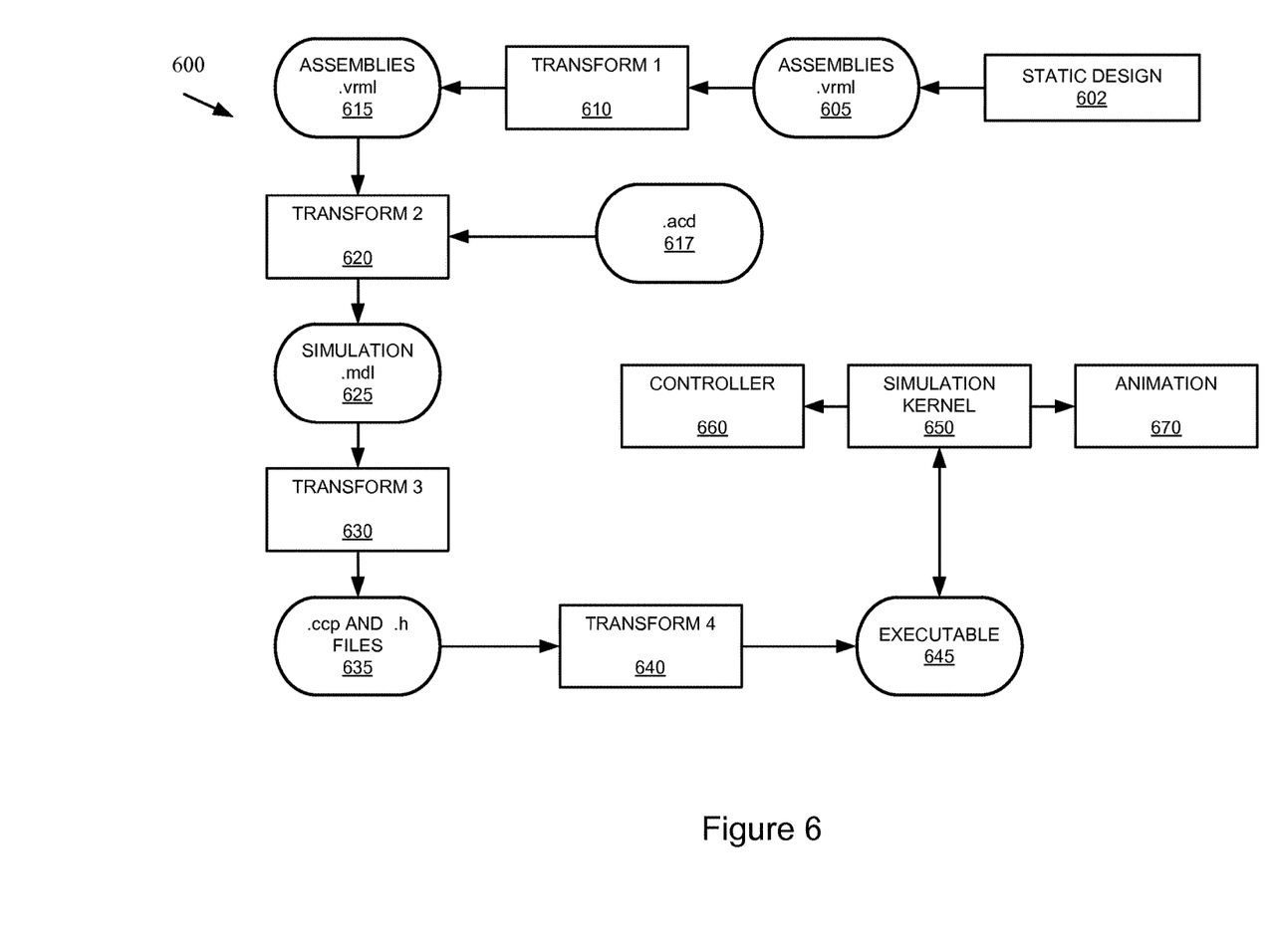
FIG. 6 illustrates an example of a system capable of creating and operating an industrial system simulation.

FIG. 1 illustrates a software system for creating and operating an industrial system simulation. FIG. 2 illustrates an example of a system capable of creating and operating an industrial system simulation. FIG. 3 illustrates a flow chart of a method of for creating an industrial system simulation. FIG. 4 illustrates a block diagram of a computer system configured to operate as a computer in an industrial system simulation. FIG. 5 illustrates a block diagram of an example computer system capable of accomplishing all or a portion of the processes within an industrial system simulation. FIG. 6 illustrates an example of a system capable of creating and operating an industrial system simulation.

Referring now to FIG. 1, illustrated is an example software system 100, which includes module 112 which, along with files 114 and 116, may be configured to accomplish creating and/or operating an industrial system simulation and animation when used with a computing apparatus.

Simulation creation module 110 is capable of creating an industrial control system simulation. The simulation may include animations and modeling and linking industrial control system inputs, outputs, and/or other modules which may be used within and industrial control system.

Simulation creation module 110 includes converter/linker/associator module 112, which is configured to convert CAD or other files 114, 116 capable of being used with an industrial controller and/or an industrial control device. Module 112 is further capable of linking an industrial control device file, such as that of a motion controller, with portions of the CAD file describing the portions of the machine the control device is controlling. The industrial control file may also include motion, process, batch, diagnostics, intelligence, and/or a control program, and/or combinations thereof.

The resulting file can be linked, by module 112 or other module, to physical inputs and outputs of an industrial controller 130, and a simulation may be created, by module 110 or other module, incorporating animation of the machine to further make the simulation more realistic in looks and functionality, as well as within the larger industrial control system simulation.

Simulation creation module 110 may be used to create an executable program, which is capable of be instantiated/executed by simulation execution module 120. Execution module 120 may receive an executable program from creation module 110, and communicate with inputs and/or outputs 130 of an industrial control system to run the simulation with inputs and/or outputs 130, as well as the animation of the complex machine.

In an example, simulation creation module 110 may reside on a Windows® workstation or other computer where a user may use the workstation and simulation creation module 110 to program/create the simulation executable program. Simulation executable module 120 may reside on another workstation, the same workstation or computer, or other computer configured to execute/run the executable in cooperation with an industrial control system, which may include inputs and/or outputs 130.

The industrial controller may be a programmable logic controller (PLC)-type system which includes a processor and interchangeable modules for input/outputs and other control system components. The industrial control system may also include a simulation module which may facilitate the running of simulation and communication with the executable program and the industrial control processor and input/output modules.

It will be appreciated that creation module 110 and execution module 120 may be within the same module and reside on the same computer location and/or workstation. Furthermore, these modules and their functionality may be accomplished on any one or combination of the different processors/computers/systems/modules in this non-limiting example.

FIG. 2 illustrates an example system 200 capable of creating and/or operating an industrial system simulation with animation. System 200 includes files 210, and mechatronics development environment (MDE) 220. MDE 220 receives file(s) 210 and converts them to a format useable with controller 260 or control device 270 and/or related software 240.

Mechatronics Development Environment (MDE) system 220 is designed to interface mechanical CAD model's simulations with controllers 240, 270 and visualization 280, 290. This interface will be helpful for quick validation of control algorithms and kinematics of designed system.

In an example, files 210 may be created in MathCAD or other program. Matlab/Simulink software is used to create simulation model using library blocks for different systems. The files may be generally two-dimensional CAD files. MDE 220 can add application program interfaces (API) components to convert the 2D files into 3D files. There may be any components in the files which may need to be linked and prepared for use by an animation 280, and industrial control simulation 250.

MDE 220 may also use module 230 to make three dimensional (3D) the information in file 210. Module 230 may include a software program SimMechanics®. SimMechanics® is capable of providing a multibody simulation environment for 3D mechanical systems, such as robots, vehicle suspensions, construction equipment, and aircraft landing gear.

A multibody system may be modeled using blocks representing bodies, joints, constraints, and force elements, and then SimMechanics® can formulate and solve the equations of motion for the complete mechanical system. Models from CAD systems, including mass, inertia, joint, constraint, and 3D geometry, can be imported into SimMechanics®. An automatically generated 3D animation lets you visualize the system dynamics. This may then be used by MDE 220 in creating the animation 280 and/or simulation 250.

Module 230 may also include SolidWorks® software, which is used for creating mechanical 3D assembly models. 3D assembly models can be created in SolidWorks using proper mate profiles like "Concentric", "Coincident" etc.

An industrial control device file, such as that of a motion controller 270, can be linked with portions of the CAD file 210 describing the portions of the machine the control device is controlling, by MDE 220.

The resulting file can be linked to physical inputs and outputs of an industrial controller 260, and a simulation 250 may be created incorporating animation of the machine to further make the simulation more realistic in looks and functionality. The animation of the machine is also needed for simulating the overall simulation. An example may be that the machine is a robot and the overall system may include conveyors and packing of parts such that the operation of the robot is needed for the simulation of the conveyors and packing of the parts.

The simulation 250 interacts with the controller 260 and the industrial control device, such as a motion controller for controlling a robot. When running, the simulation may show the animation 280 as well as the rest of the simulated system.

Also, the human machine interface (HMI) 290 may be shown as well. The HMI 290 is the user interface an operator may see and use to control the system when the system is actually in use. The HMI 290 may include push buttons, lights, control switched, a touch screen, etc.

Industrial controller 260 is programmed using ladder-logic type programming, which is referred to herein as an industrial control program. The industrial control program is typically stored in memory of the industrial control system 230, and executed by the industrial control processor module.

Industrial controller system 260 also includes a simulation module which is configured to assist in running the simulation, and communication with the rest of the system. Simulation module may also include a processor to aid the creation, execution, and/or any other step or process of the communication, creation, execution, or running of the simulation. Simulation module is capable of running/instantiating any of the software described herein, in particular the software described in FIG. 1.

FIG. 3 illustrates a flow chart of an example method of creating a simulation optionally including animation for an industrial control system (300). Various operations of this method may be performed by one or more processing systems, and there is no need to tie any operation to any specific processing system as general purpose computers/processors may be configured to operate as systems capable of performing the operations of the method described herein.

Method 300 includes converting file(s) 310, linking the converted file 320, associating inputs/outputs 330, and creating a simulation 340. Converting file(s) 310 may include using module 110 and/or 112. In an example converting file(s) 310 may also include converting a CAD file, such as from MathCAD®, AutoCAD®, or SolidWorks® or the like, to a format usable with or by industrial control software. The CAD file may be of a robot or other complex machine.

The converted file can then be linked with an industrial control device file (320), such as that of a motion controller, can be linked with portions of the CAD file describing the portions of the machine (robot) the control device is controlling. The linking may include linking portions of the CAD file to control variable(s) of the industrial control device file.

The resulting file can be associated with physical inputs and outputs of an industrial controller (330). This may be accomplished via software and/or a control file of the industrial controller.

A simulation may be created (340) incorporating animation of the machine to further make the simulation more realistic in looks and functionality, based at least in part on the associated linked file. The simulation may then be executed by computer(s) 400, and/or 500, and displayed to the user as described in FIG. 2.

Referring now FIG. 4, a computer/processor/workstation system 400 and the associated discussion are intended to provide a brief, general description of a suitable computing environment in which the software in FIG. 1 and FIG. 2, and the process illustrated in FIG. 3 may be implemented. Many other configurations of computing devices and software computing systems may be employed to implement a system for creating and operating an industrial simulation system.

Computer/processor/workstation system 400 may be any type of computing system capable of creating and/or operating an industrial system simulation including a described animation, such as a server computer, client computer, internet appliance, PLC, rack-type processor, or any combination or variation thereof. Indeed, computer/processor/workstation system 400 may be implemented as a single computing system, but may also be implemented in a distributed manner across multiple computing systems.

In an example, computer/processor/workstation system 400 may be representative of a server system (not shown) with which the computer systems (not shown) running software 401 may communicate to enable creation of simulations described herein. However, computer/processor/workstation system 400 may also be representative of the computer systems that run software 406. Indeed, computer/processor/workstation system 400 is provided as an example of a general purpose computing system that, when implementing software in FIGS. 1 and 2, and the process illustrated in FIG. 3, becomes a specialized system capable of creating and/or operating an industrial system simulation.

Computer/workstation system 400 includes processor 402, storage system 404, and software 406. Processor 402 is communicatively coupled with storage system 404. Storage system 404 stores simulation software 406 which, when executed by processor 402, directs computer/processor/ workstation system 400 to operate as described for the method illustrated in FIG. 3 and/or operate the software in FIGS. 1 and 2.

Referring still to FIG. 4, processor 402 may comprise a microprocessor and other circuitry that retrieves and executes simulation software 406 from storage system 404. Processor 402 may be implemented within a single processing device but may also be distributed across multiple processing devices or sub-systems that cooperate in executing program instructions. Examples of processor 402 include general purpose central processing units, application specific processors, PLC processor modules, simulation module processors, and graphics processors, as well as any other type of processing device.

Storage system 404 may comprise any storage media readable by processor 402 and capable of storing any portion or all of simulation software 406. Storage system 404 may include volatile and nonvolatile, removable and non-removable media implemented in any method or technology for storage of information, such as computer readable instructions, data structures, program modules, or other data. Storage system 404 may be implemented as a single storage device but may also be implemented across multiple storage devices or sub-systems. Storage system 404 may comprise additional elements, such as a controller, capable of communicating with processor 402.

Examples of storage media include random access memory, read only memory, magnetic disks, optical disks, and flash memory, as well as any combination or variation thereof, or any other type of storage media. In some implementations, the storage media may be a non-transitory storage media. In some implementations, at least a portion of the storage media may be transitory. It should be understood that in no case is the storage media a propagated signal.

Simulation software 406 comprises computer program instructions, firmware, or some other form of machine-readable processing instructions, and/or combinations thereof, having at least some portion of software in FIGS. 1 and 2, and the process illustrated in FIG. 3 embodied therein. Simulation software 406 may be implemented as a single application but also as multiple applications. Simulation software 406 may be a stand-alone application but may also be implemented within other applications distributed on multiple devices, including but not limited to other design software and operating system software.

In general, simulation software 406 may, when loaded into processor 402 and executed, transform processor 402, and computer/processor/workstation system 400 overall, from a general-purpose computing system into a special-purpose computing system customized to aid in the creation, execution, and/or running of the industrial system simulation as described by the software in FIGS. 1 and 2, and the process illustrated in FIG. 3 and its associated discussion.

Encoding simulation software 406 may also transform the physical structure of storage system 404. The specific transformation of the physical structure may depend on various factors in different implementations of this description. Examples of such factors may include, but are not limited to: the technology used to implement the storage media of storage system 404, whether the computer-storage media are characterized as primary or secondary storage, and the like.

For example, if the computer-storage media are implemented as semiconductor-based memory, simulation software 406 may transform the physical state of the semiconductor memory when the software is encoded therein. For example, simulation software 406 may transform the state of transistors, capacitors, or other discrete circuit elements constituting the semiconductor memory.

A similar transformation may occur with respect to magnetic or optical media. Other transformations of physical media are possible without departing from the scope of the present description, with the foregoing examples provided only to facilitate this discussion.

Through the operation of computer/processor/workstation system 400 employing simulation software 406, transformations are performed on input data 408, resulting in output data 410. As an example, input data 408 could be considered transformed from one state to another by the transformation of various elements of simulation data contained therein.

Computer/processor/workstation system 400 may have additional devices, features, or functionality. Computer/processor/workstation system 400 may optionally have input devices such as a keyboard, a mouse, a voice input device, or a touch input device, and comparable input devices. Output devices such as a display, speakers, printer, and other types of output devices may also be included.

Computer/processor/workstation system 400 may also contain communication connections and devices that allow computer/processor/workstation system 400 to communicate with other devices, such as over a wired or wireless network in a distributed computing and communication environment. These devices are well known in the art and need not be discussed at length here. Examples of computer/processor/workstation system 400 may be a PLC processor, a processor in simulation module, and/or other computers capable of accomplished all or a portion of the processes described within this disclosure.

FIG. 5 illustrates a block diagram of a computer system 500 capable of accomplishing all or a portion of the processes described within this disclosure. The software in FIGS. 1 and 2, and the process illustrated in FIG. 3 may be implemented on one or more computers 500, as shown in FIG. 5. Computer 500 includes communication interface 502, display 504, input devices 506, output devices 508, processor 510, and storage system 512. Processor 510 is linked to communication interface 502, display 504, input devices 506, output devices 508, and storage system 512. Storage system 512 includes a non-transitory memory device that stores operating software 514.

Communication interface 502 includes components that communicate over communication links, such as network cards, ports, RF transceivers, processing circuitry and software, or some other communication devices. Communication interface 502 may be configured to communicate over metallic, wireless, or optical links. Communication interface 502 may be configured to use TDM, IP, Ethernet, optical networking, wireless protocols, communication signaling, or some other communication format—including combinations thereof.

Display 504 may be any type of display capable of presenting information to a user. Displays may include touch screens in some embodiments. In an example, display is capable of displaying HMI 290, animation 280, and any other portions of the created simulation.

Input devices 506 include any device capable of capturing user inputs and transferring them to workstation 500. Input devices 50 may include a keyboard, mouse, touch pad, or some other user input apparatus. Output devices 508 include any device capable of transferring outputs from computer 500 to a user. Output devices 508 may include printers, projectors, displays, or some other user output apparatus. Display 504, input devices 506, and output devices 508 may be external to computer 500 or omitted in some examples.

Processor 510 includes a microprocessor and other circuitry that retrieves and executes operating software 514 from storage system 512. Storage system 512 includes a disk drive, flash drive, data storage circuitry, or some other non-transitory memory apparatus. Operating software 514 includes computer programs, firmware, or some other form of machine-readable processing instructions. Operating software 514 may include an operating system, utilities, drivers, network interfaces, applications, or some other type of software. When executed by processing circuitry, operating software 514 directs processor 510 to operate computer 500 according to software/hardware in FIGS. 12, and 6, and the process illustrated in FIG. 3.

In this example, computer 500 executes a number of methods stored as software 514 within storage system 512. The results of the simulation and/or animation design, creation, and implementation are displayed to a user via display 504, or output devices 508. Input devices 506 allow users to input a variety of data required by the industrial control system simulation.

For example, processor 510 receives input data 408 either from communication interface 502, input devices 506, or storage system 512. Processor 510 then operates on input data 408 to produce output data 410 which may be stored in storage system 512, displayed on display 504, or output through output devices 508.

It will be appreciated that portions and/or all of the simulation creation and execution may be accomplished on various portions of systems 100 200, and 600, as well as by computers 400 and/or 500, and/or combinations thereof.

FIG. 6 illustrates an example system 600 capable of creating and/or operating an industrial system simulation with animation. System 600 includes static design files 602, which are used to create assemblies 605. Static design files 602 may generally include CAD drawings of unlinked 2D objects. Assemblies can be in a .vrml format or other format as needed.

Transform 1 may receive assemblies 605 and combine them with APIs to link the various parts to construct 3D objects such that the resulting second assemblies 615 may include 3D objects which can be used to create a simulation 625.

The simulation model assemblies 615 that are created from the 3D CAD model in Solidworks™ contains body blocks and assembly parts that are connected using joint blocks. This simulation model is intended to represent the dynamic behavior of a designed 3D mechanical system. It can be used for control system development and verification.

Transform 2 may link the 3D assemblies 615 and motion control programming 617, such that commands from the motion control programming will cause movement and simulated control of the 3D assemblies 615 to create the simulation 625. The motion control programming 617 may be in a .acd file, which may include a project file used for programming Rockwell Automation Logix platforms, such as ControlLogix®, CompactLogix®, FlexLogix®, SoftLogix5800®, and DriveLogix® systems or others. The .acd file may also include instructions for industrial controllers and processors.

Transform 2 may also connect the mechanical assemblies 605 to the motion controller motion tags from motion control programming. The control signals that are generated in the controller 617 are connected to the joint blocks using port signals into joint actuator blocks from the SimMechanics toolbox of the Simulink™ tool.

Simulation 625 may include an .mdl file, which can include simulation models to be used with Simulink®, a simulation and model-based design application, which can be used with MathCAD. This type of file may contain the block diagram and block properties of the simulation 625. MDL files are usually saved in a plain text format and typically include a list of objects. Each object contains a set of properties and values that are delimited by line breaks.

Transform 3 may receive simulation 625 and create C or C++ code files 635, which corresponds to the various objects and motion of the simulation 625. Code files may include .ccp and .h—type files, among others.

Transform 4 can receive code files 635 and may add APIs to allow the resulting executable 645 to interact with and industrial controller 660 and a simulation/animation 670. Transform 4 can produce the plant simulation executable 645 merged with controller communication ports within the simulation.

In an example, animation 670 may include the use of Instant Reality Player, which is an open source VRML file browser. It is used to view 3D graphics models with run time applications. Instant reality Player allows external authoring interface (EAI) to animate 3D graphics with controller signals.

Controller 660 may include a hardware module to assist in running the simulation. The physical I/O and other modules of the industrial control system may be modeled, and specific communication channels may be created by a modeling software module. This may reduce delays within the system and software of the simulation, thereby increasing the likelihood that the timing of the simulation may be more like real-time operation of the industrial control system.

Executable 645 may be used with simulation kernel 650 to run the simulation with the physical industrial control system 660, and the animation 670. Animation 670 can include a user interface, such as a display, to show the operation of the 3D simulation. Furthermore, animation 670 may include operation of HMI 290.

Kernel 650 establishes the connections with the industrial control system 660 and the animation 670 to the executable simulation 645. Kernel 650 can be configured to permit the coordination of the data transmission between the I/O and the server level I/O module entries via a multi channel transmission control protocol and/or user data protocol (TCP/UDP) connection array. This may reduce delays within the system and software of the simulation, thereby increasing the likelihood that the timing of the simulation may be more like real-time operation of the industrial control system.

Simulation and Controller Interface

To connect the virtual controller 660 outputs signals to the simulation, it is necessary to establish an interface 650 between simulation and controller. The SimKit tool that has been developed by the Advanced Technology Lab at Rockwell Automation enables connectivity and data exchange in a bidirectional way between simulation 645 and controller 660. SimKit uses the Emulate controller hardware module within a PLC to encapsulate the control programs. The emulator mimics the ControlLogix PLC functions but in software only.

The virtual controller 660 transfers data to the simulation 645 using output tags and receives data from the simulation 645 using input tags. A configurator component hosts the application-level information for connecting the virtual controller 660 with the simulation 645. A Tag Server coordinates the input and output tags data exchange. A Synchronizer coordinates the clock progression between the controller and simulation to keep them synchronized.

Simulation and Virtual Reality Interface

Real time animation of the designed system is used to get insight in to the behavior of the system during the control program execution. The VRML-based reality model of the robot assembly is a static type which cannot create animation. In the vision tool, an API interface is used to inject scene animation into the graphical assembly in real-time.

The robot graphical model is processed to organize it into a hierarchical set of assemblies with scene modifier element in each. Basic VRML language and parts are: Scenes, Nodes, and Events. 3D scenes are defined by the hierarchical structure tree of nodes (Objects). The characteristics of each node are stored in the fields. Events are used to transfer information in and out of each node.

In this visualization interface, a "Transform" node is mainly used to animate the CAD model parts. "Transform" is a grouping node in VRML format. It contains translation, rotation, scale, orientation and center fields that define the 3D information of the object. Translation field takes 3 arguments as [x, y, z] position of the object. Rotation field data type is a vector of 4 arguments [x, y, z, angle]. First three coordinates represent orientation in the 3D space and fourth element is an orientation angle, defined in radians. A Transform node has input type events as set_translation, set_rotation, set_scale and output type events as get_translation, get_rotation, and get_scale. Transform is defined in VRML format as:

```
Transform {
    exposedField SFRotation    rotation      0 0 1 3.14
    exposedField SFVec3f       translation   0 0 0
    exposedField SFVec3f       scale         1 1 1
    field        SFVec3f       bboxCenter    0 0 0
    field        SFVec3f       bboxSize     -1 -1 -1
}
```

For example, SFRotation (0, 0, 1, 3.14) defines the rotation of object around z axis with 3.14 radians value. Translation (0, 0, 0) defines the translation from origin position. Field values can be modified dynamically using an API event during the animation process. The API contains a set of methods that can be called to change the VRML scenes. Each scene is correlated to a motion control position in the robot joints that is being produced in the simulation of the robot.

Control Program Development

A control program for pick and place motion was developed in Studio5000. PLC motion group instructions MCT (Motion Coordinated Transform) and MCLM (Motion Coordinate Linear Move) were selected to carry out the motion control [8]. The MCT instruction is used to link two coordinate systems together. This is like a bi-directional gearing. One way to use the transform is to move a non-Cartesian robot to Cartesian positions. The MCLM instruction is used to start a single or multi-dimensional linear coordinated move for the specified axes within a Cartesian coordinate system. Then, the goal was to define the motion control algorithm and gain tunning that would be able to execute the target trajectory.

The combined effect of MCT and MCLM allowed converting the cartesian coordinates for each target point in the trajectory into driving torque for the join actuators of the robot (join motors). The combined effect of MCT and MCLM allowed converting the cartesian coordinates for each target point in the trajectory into driving torque for the join actuators of the robot (join motors).

Motor drives take these command position values and generate torque as an output for each joint axis movement. Current positions of the actuators are feedback to the drivers for completing the closed loop control in between the drivers and the motors. The combined effect of the different information sources helps in simplifying the programming of the PLC for this robotics application. However, this concept is not restricted to robotics and it can be applied to other systems.

Animation

The next step in the information flow is the integration of the motion control and system response visualization. A software application was created to generate associations (links) between graphical components and motion coordinates. The intention in this step was to remove the graphical computation burden from the simulation so to accelerate the simulation loop.

In this manner, the window of observation into the simulation could be reduced to just a few seconds of simulation time. The intention is to make the simulation less computationally intensive, and to dedicate its CPU time to simulation crunching rather than graphical rendering. In motion control applications, where response times are very stringent, a feature that separates the graphical computation from core calculations can be highly valuable and desirable.

This software application creates connection tags between the CAD assemblies and the motion control tags. Based on the part and tag connection information, the simulation model is extended with a set of connecting ports representing the input side signals into the simulation and the output side signals from the simulation into the visualization tool throughout the 3D API.

The robot control program can be downloaded to the virtual controller. Simkit can be used to link the I/O tags of controller and simulation. Control program and plant simulation can exchange the data in pseudo real time. The robot simulation produced part rotation and translation data can be transferred to the VRML viewer throughout the 3D API. The results of the motion control algorithm that is developed for controlling this robot can be checked by plotting the current position of the end effector in the simulation environment, and can be compared with the commanded position in the control program.

Figure 7:
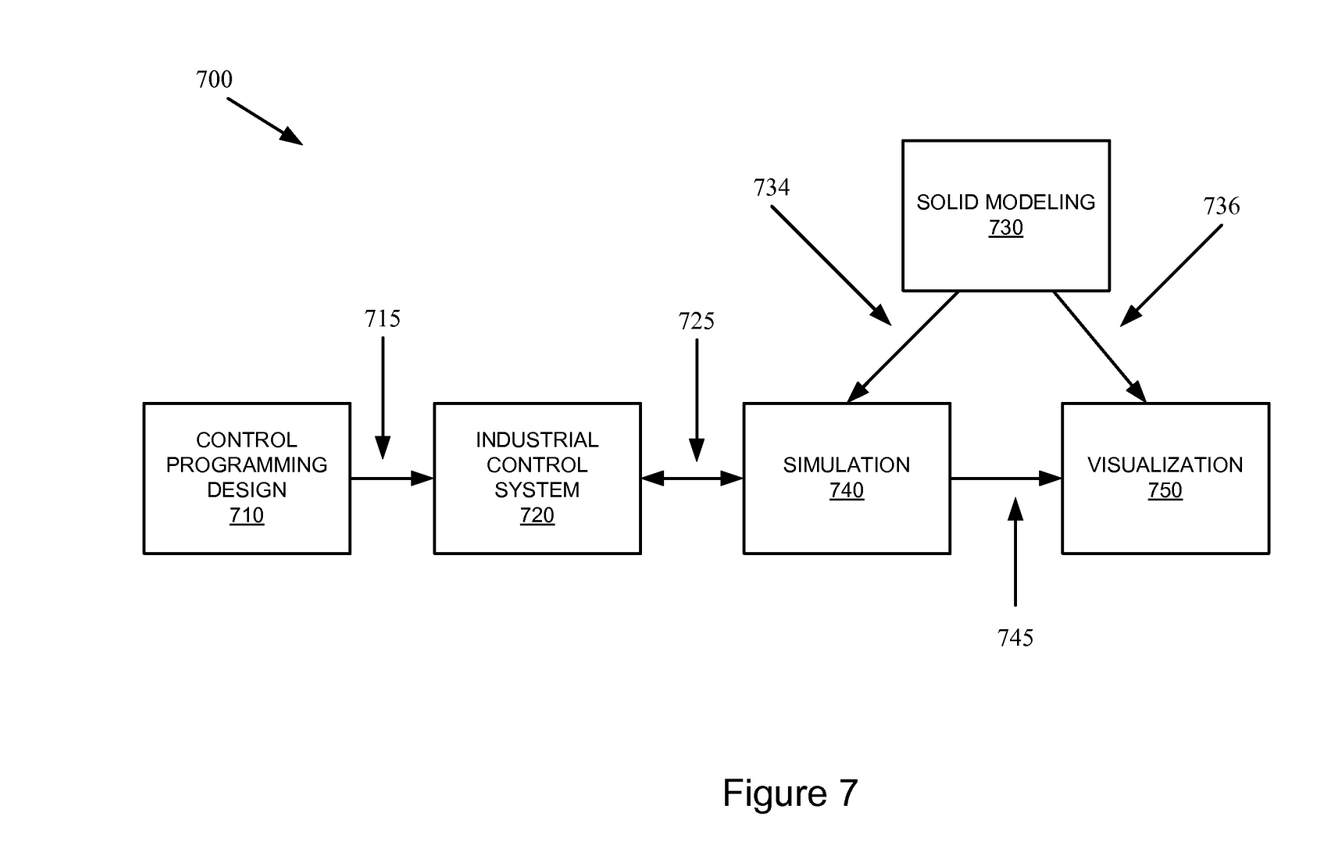
FIG. 7 illustrates an example of a system capable of creating and operating an industrial system simulation.

FIG. 7 illustrates an example of a system 700 capable of creating and operating a mech-tronics industrial system simulation. To integrate design, control, simulation and visualization, the following system and work flow may be used. According to an example, the system architecture may consist generally of five main parts: 1) Control program design 710, 2) Controllers 720, 3) Plant Simulation 740, 4) CAD 730, and 5) Visualization 750. Industry based tools and open source software may be used to carry out these design activities.

In an example, control design 710 is carried in the Rockwell Automation's Studio5000™ programming tool. Control program execution 720 can be carried out in the Emulate virtual controller from Rockwell Automation. Component/Machine simulation 740 may be carried out in the Matlab/Simulink™ tool. Solid modeling 730 can be carried in the Solidworks™ tool. And, visualization 750 is performed in an open source Virtual Reality Modeling Language (VRML) tool from InstantReality Company.

Each of these tools brings its own data structure and information formats into the design process. The challenge for the integrated design and validation environment is to glue the pieces of information into a common information-exchange structure that can be used to harmonize the components into a rapid prototyping environment.

In FIG. 7, an example information flow of the integrated system is shown. The solid modeling phase 730 produces a three dimensional representation of the mechanical system to be controlled. The solid model is converted into two information elements: 1) kinematics simulation 734 and 2) graphical assemblies 736. The Solidworks™ tool provides plugins to generate both data files as a Matlab™ simulation and VRML export files.

The Studio5000™ tool is an industrial control design 710 tool that is used to create the control algorithms 715 written in an IEC 61131 based programming language. The control program is deployed in the virtual controller within industrial control system 720.

The kinematics simulation 734 is downloaded to the Matlab™ tool for simulating the machine under specific load conditions. The simulation 740 is to interact with the controller 720 at runtime to stimulate the controlling algorithms with the responses of the machine that is put under stress with dynamic loading and control profiles.

Graphical assemblies 736 will be further processed to become a hierarchical data structure of graphical description that can be animated in the visualization tool 750. The visualization tool collects the real time data that is generated in the controller-to-simulation interaction 745.

Different methods may be used to connect each phase of this information flow. Control program parameters are transferred between the simulation 740 and the controllers 720 using an I/O interface 725. Matlab™ provides SimMechanicsLinks plugin for CAD software Solidworks™ to transfer the CAD model 734 into simulation 740. The simulation model 740 contains mass and inertial properties of each body parts of the CAD drawings. This information is fundamental to be able to generate animation of the mechanical system.

Kinematics and dynamical information of the model 740 can be used to generate realistic model conditions since the actual physical properties of the model are included in the simulation calculations. A high quality and realistic animation can be produced in any VRML compatible tool using the exported VRML models. VRML provides open source, platform independent graphical language to create and view 3D models. VRML is a text based language so it can be easily edited using any text editor. To bring the VRML tool into this workflow, it is necessary to attach an API to it so it can communicate with the other parts of the system.

Based on this work flow, an application can be created using these different systems under one platform. Robots are widely used in industrial automation applications and their control algorithms are developed by system engineers. In an example, Denso VS-6556G six-axis articulated robot model may be used. A desired motion profile for the robot end effector position is established in the controlling program 710 using command position profiles.

The command positions are points of desired motion trajectory for the end effector. To achieve a desired position of the end effector, different parts (links) of the robot must be placed in a position by the driving motors at the link joints. These motors are driven by torque signals that are to be calculated by the controlling drivers. But the controlling torque depends on the knowledge of the system response to the torque and the load at the end effector. In the classical design approach, these pieces of information are known by trial and error or by experienced designers. The intent here is to capture the information flow for automating the process of generating the feedback information for the drivers and controllers. Based on the drivers' torque signal, each joint will move and the end effector will move in the space to a target location. Current position is the feedback to the drivers and controllers for close loop control.

A work flow, validation framework and process to enable a virtual design engineering environment have been presented. The environment enables interoperability of solid model design, controllers, simulation, and visualization tools into an integrated development environment. Results showed that the selected work flow and information exchange could be assembled in an automated system. The deployment of the virtual design engineering environment permitted observing in real time the effect of the controlling algorithm on the machine prototype which was simulated and controlled by motion instructions. This disclosure enables early validation of controlling logic for complex industrial automation projects and plants. The benefits include the reduction of engineering cost, time and resources during the design of products. Moreover, the virtual design engineering environment opens new opportunities to train engineers and operators in controls.

It must be noted that the invention can be used in two main phases: (1) design phase runtime and (2) commissioned phase runtime. In (1), the industrial control device can be real or emulated. Either encapsulation is connected to simulation. In (2), the industrial control device and the simulation executes in parallel with real controller. Moreover, the purpose of the system is to help system engineers create optimized industrial control programs. Studio 5000 designer allows for online editing of the control program. The design is incrementally improved in virtual design.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method for creating a simulation of an industrial automation system comprising:
    converting an input file to a format capable of being used with an industrial control device program in a simulation of an industrial control system by a computing device;
    linking portions of the converted file with an industrial control device file at least in part using a linking module;
    associating the linked file to physical inputs and outputs of an industrial control system at least in part using an associating software module,
        wherein the industrial control system comprises a physical industrial control module, the physical industrial control module being operatively linked to the physical inputs and outputs of the industrial control system;
    creating a simulation incorporating at least animation, based at least in part on the associated linked file at least in part using a simulation creation module; and
    executing the simulation at least in part using the computing device and the physical industrial control module.

2. The method of claim 1 wherein the input file is a computer aided design file.

3. The method of claim 1, wherein the simulation further comprises executing an emulation of industrial control devices.

4. The method of claim 3, wherein the industrial control device comprises motion, process, batch, diagnostics, intelligence, and/or a control program, and/or combinations thereof.

5. The method of claim 4, wherein the industrial control device comprises a motion controller, and the industrial control system comprises a programmable logic controller.

6. The method of claim 1, wherein the converting and/or associating comprises using at least application program interfaces configured to interface with other programs and file types.

7. One or more non-transitory computer readable storage media having program instructions stored thereon for creating a simulation of an industrial control system that, when executed by a computing system, direct the computing system to at least:
create a file comprising three dimensional information from at least a computer aided design file comprising two dimensional information of an industrial machine, by a computing device;
create an industrial control system simulation using at least an industrial control system program from an industrial control device, and the created file comprising three dimensional information by the computing device;
link portions of the simulation file with corresponding physical industrial inputs and outputs of the industrial control device, and
execute the simulation at least in part using the computing device and the industrial control device,
wherein the simulation comprises animation information configured to graphically simulate the operation of the industrial machine.

8. The one or more non-transitory computer readable storage media of claim 7, having further instructions wherein the create an industrial control system simulation comprises using application program interfaces configured to interface with other programs and file types.

9. The one or more non-transitory computer readable storage media of claim 7, having further instructions wherein the industrial control device comprises motion, process, batch, diagnostics, intelligence, and/or a control program, and/or combinations thereof.

10. The one or more non-transitory computer readable storage media of claim 7, having further instructions which cause the computing system to simulate operation of an industrial control system comprising a programmable logic controller.

11. The one or more non-transitory computer readable storage media of claim 10, having further instructions wherein the industrial control system further comprises physical inputs and outputs and an emulation module.

12. The one or more non-transitory computer readable storage media of claim 11, having further instructions wherein the programmable logic controller is operatively linked to the physical inputs and outputs.

13. The one or more non-transitory computer readable storage media of claim 11, having further instructions which cause the computing system to execute the simulation, wherein the simulation simulates operation of the industrial machine, industrial control system, and/or the industrial controller.

14. The one or more non-transitory computer readable storage media of claim 7, having further instructions which cause the computing system to simulate the operation of the industrial machine, the industrial machine comprising a multi-axis industrial machine.

15. A system for creating a simulation of an industrial control system, comprising:
an industrial control device comprising programming configured to control an industrial machine; and
a computing device comprising one or more computer readable storage media having program instructions stored thereon for creating a simulation of an industrial control system that, when executed by a computing system, direct the computing system to at least:
create a file comprising three dimensional information from at least a computer aided design file comprising two dimensional information of the industrial machine;
create an industrial control system simulation using at least the industrial device programming and the created file comprising three dimensional information;
link portions of the simulation file with corresponding physical industrial inputs and outputs of the industrial control device; and
execute the simulation at least in part using the computing device and the industrial control device,
wherein the simulation comprises animation information configured to graphically simulate the operation of the industrial control system on a display operationally coupled to the computing system.

16. The system of claim 15, wherein the industrial control device comprises motion, process, batch, diagnostics, intelligence, and/or a control program, and/or combinations thereof.

17. The system of claim 15, wherein the industrial control system comprises a programmable logic controller.

18. The system of claim 15, wherein the industrial machine comprises a multi-axis machine.

19. The system of claim 15, wherein the computer aided design file includes a solid model and the instruction further direct the computing system to at least convert the solid model a kinematics simulation element and a graphical assemblies element.

20. The system of claim 19, wherein the instructions further direct the computing system to translate the graphical assemblies element into a hierarchical data structure of graphical description that can be animated.

* * * * *